United States Patent
Koopmann et al.

(10) Patent No.: US 11,249,114 B2
(45) Date of Patent: Feb. 15, 2022

(54) TRIGGER METHOD AND MEASUREMENT DEVICE COMPRISING A CORRESPONDING TRIGGER METHOD

(71) Applicant: Rohde & Schwarz GmbH & Co. KG, Munich (DE)

(72) Inventors: Bendix Koopmann, Garching (DE); Johann Tost, Munich (DE)

(73) Assignee: Rohde & Schwarz GmbH & Co. KG, Munich (DE)

(*) Notice: Subject to any disclaimer, the term of this patent is extended or adjusted under 35 U.S.C. 154(b) by 188 days.

(21) Appl. No.: 16/513,386

(22) Filed: Jul. 16, 2019

(65) Prior Publication Data

US 2021/0018535 A1    Jan. 21, 2021

(51) Int. Cl.
*G01R 13/02* (2006.01)

(52) U.S. Cl.
CPC ..... *G01R 13/0254* (2013.01); *G01R 13/0272* (2013.01)

(58) Field of Classification Search
CPC ................ G01R 13/0254; G01R 13/0272
USPC .................................................. 702/66
See application file for complete search history.

(56) References Cited

U.S. PATENT DOCUMENTS

| 10,330,812 | B1* | 6/2019 | Barnett | G01V 3/08 |
| 2006/0161361 | A1* | 7/2006 | Tabatabaei | G01R 31/31709 702/69 |
| 2006/0265213 | A1 | 11/2006 | Bernard | |
| 2007/0118317 | A1* | 5/2007 | Corredoura | G01R 13/0254 702/79 |
| 2008/0297139 | A1 | 12/2008 | Freidhof et al. | |
| 2010/0063791 | A1 | 3/2010 | Wen et al. | |

* cited by examiner

*Primary Examiner* — Michael P Nghiem
(74) *Attorney, Agent, or Firm* — Potomac Technology Law, LLC

(57) ABSTRACT

A trigger method for triggering a measurement device on a signal pattern in a signal is provided. The trigger method comprises the steps of receiving the signal pattern, receiving the signal, computing a first cross-correlation of the signal pattern and the signal, and triggering the measuring device, based upon the first cross-correlation.

11 Claims, 4 Drawing Sheets

TRIGGER METHOD AND MEASUREMENT DEVICE COMPRISING A CORRESPONDING TRIGGER METHOD

TECHNICAL FIELD

The invention relates to a trigger method for triggering on a signal pattern in a signal and a measurement device comprising a trigger apparatus for triggering on a signal pattern in a signal.

BACKGROUND

Generally, in times of an increasing number of applications employing multiple circuits, there is a growing need of a trigger method for triggering on a signal pattern in a signal and a measurement device comprising a corresponding trigger apparatus with respect to a device under test comprising such an application in order to verify correct functioning of said applications in a highly accurate and efficient manner.

US 2008/0297139 A1 provides an approach for digital triggering a recording of one or more digitized signals on a digital oscilloscope by means of carrying out a level comparison for determining a triggering instant in each case between two successive sample values of a reference signal and a threshold values. According to the approach, at least one additional sample value of the reference signal is determined between two sequential samples of the reference signals by means of interpolation. Disadvantageously, especially due to the additional sample, said approach is quite inefficient.

Accordingly, there is a need to provide a trigger method for triggering on a signal pattern in a signal and a measurement device comprising a trigger apparatus for triggering on a signal pattern in a signal, whereby both a high accuracy and a high efficiency are ensured.

SUMMARY

Embodiments of the present invention advantageously address the foregoing requirements and needs, as well as others, by providing a trigger method for triggering on a signal pattern in a signal and a measurement device comprising a trigger apparatus for triggering on a signal pattern in a signal, whereby both a high accuracy and a high efficiency are ensured.

According to a first aspect of the invention, a trigger method for triggering on a signal pattern in a signal is provided. The trigger method comprises the steps of receiving the signal pattern, receiving the signal, and computing a first cross-correlation of the signal pattern and the signal. Advantageously, both a high accuracy and efficiency can be ensured. Further advantageously, the signal pattern may comprise any waveform, thereby reducing complexity and further increasing efficiency. As a further advantage, it can be triggered on signals which cannot be detected by human observation.

According to a first preferred implementation form of the first aspect of the invention, the trigger method further comprises the step of triggering based upon the first cross-correlation result. Advantageously, for instance, accuracy and efficiency can be increased further.

According to a second preferred implementation form of the first aspect of the invention, the trigger method further comprises the step of interpolating the signal pattern and at least a section of the signal correlating with the signal pattern. Advantageously, for example, the signal pattern and the respective matched signal may be interpolated. As a further example, the signal pattern shortened by a leading and/or tailing sample and the respective matched signal may be interpolated.

According to a further preferred implementation form of the first aspect of the invention, the trigger method further comprises the step of computing a second cross-correlation of the interpolated signal pattern and the interpolated at least one signal section. Advantageously, for instance, accuracy, especially the respective inter-sample accuracy, can be increased further.

According to a further preferred implementation form of the first aspect of the invention, the trigger method further comprises the step of triggering based upon the second cross-correlation result. Advantageously, for example, not only accuracy but also efficiency can be increased.

According to a further preferred implementation form of the first aspect of the invention, the signal pattern comprises a signal pattern vector. Advantageously, for instance, complexity can be reduced, thereby increasing efficiency.

According to a further preferred implementation form of the first aspect of the invention, the signal comprises a signal vector. Advantageously, for example, efficiency can be increased by reducing complexity.

According to a further preferred implementation form of the first aspect of the invention, the first cross-correlation comprises a first cross-correlation vector. Advantageously, for instance, complexity can be reduced, which leads to an increased efficiency.

According to a further preferred implementation form of the first aspect of the invention, the trigger method further comprises the step of shifting the signal pattern through the signal. Advantageously, for example, both accuracy and efficiency can be increased further.

According to a further preferred implementation form of the first aspect of the invention, the trigger method further comprises the step of defining a threshold. Advantageously, for instance, the threshold may be 95% of the respective highest peak, preferably 90% of the respective highest peak, more preferably 80% of the respective highest peak, most preferably 70% of the respective highest peak.

According to a further preferred implementation form of the first aspect of the invention, the trigger method further comprises the step of finding at least one cluster over the threshold. Advantageously, for example, accuracy can be increased further.

According to a further preferred implementation form of the first aspect of the invention, the trigger method further comprises the step of defining at least one respective cluster border as at least one not successive sample. Advantageously, for instance, efficiency can be increased further.

According to a further preferred implementation form of the first aspect of the invention, the trigger method further comprises the step of finding the respective maximum per each of the at least one cluster. Advantageously, for example, not only accuracy but also efficiency can be increased further.

According to a further preferred implementation form of the first aspect of the invention, the trigger method further comprises the step of using the respective peak of the second cross-correlation for the respective inter-sample accuracy. Advantageously, for instance, accuracy can be increased further.

According to a further preferred implementation form of the first aspect of the invention, the second cross-correlation comprises a second cross-correlation vector. Advantageously, for example, complexity can be reduced, thereby increasing efficiency.

According to a further preferred implementation form of the first aspect of the invention, the trigger method further comprises the step of shortening the signal pattern by a respective leading sample. Advantageously, for instance, efficiency can be increased further.

According to a further preferred implementation form of the first aspect of the invention, the trigger method further comprises the step of shortening the signal pattern by a respective tailing sample. Advantageously, for example, efficiency can be increased further.

According to a further preferred implementation form of the first aspect of the invention, the trigger method further comprises the step of outputting at least one trigger point, preferably a vector of trigger points, comprising the respective sample of the respective maximum per each of the at least one cluster. Advantageously, for instance, a high efficiency can be ensured.

According to a further preferred implementation form of the first aspect of the invention, the trigger method further comprises the step of outputting at least one trigger point, preferably a vector of trigger points, comprising the respective sample of the respective maximum per each of the at least one cluster and the corresponding inter-sample offset. Advantageously, for example, a particularly high accuracy can be ensured. Further advantageously, as an example alternative, corresponding inter-sample offsets may be used instead of the corresponding inter-sample offset.

According to a second aspect of the invention, a measurement device comprising a trigger apparatus for triggering on a signal pattern in a signal is provided. In this context, the trigger apparatus is configured to receive the signal pattern and the signal. In addition to this, the trigger apparatus is configured to compute a first cross-correlation of the signal pattern and the signal. Advantageously, both a high accuracy and efficiency can be ensured. Further advantageously, the signal pattern may comprise any waveform, thereby reducing complexity and further increasing efficiency. As a further advantage, it can be triggered on signals which cannot be detected by human observation.

All preferred implementation forms as discussed above for the first aspect also work for the second aspect in a manner that the measuring device is configured in order to perform the respective method steps.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

BRIEF DESCRIPTION OF THE DRAWINGS

Example embodiments of the invention are now further explained with respect to the drawings by way of example only, and not for limitation. In the drawings.

DETAILED DESCRIPTION

A processor, unit, module or component (as referred to herein) may be composed of software component(s), which are stored in a memory or other computer-readable storage medium, and executed by one or more processors or CPUs of the respective devices. A module or unit may alternatively be composed of hardware component(s) or firmware component(s), or a combination of hardware, firmware and/or software components. Further, with respect to the various example embodiments described herein, while certain of the functions are described as being performed by certain components or modules (or combinations thereof), such descriptions are provided as examples and are thus not intended to be limiting. Accordingly, any such functions may be envisioned as being performed by other components or modules (or combinations thereof), without departing from the spirit and general scope of the present invention. Moreover, the methods, processes and approaches described herein may be processor-implemented using processing circuitry that may comprise one or more microprocessors, application specific integrated circuits (ASICs), field programmable gate arrays (FPGAs), or other devices operable to be configured or programmed to implement the systems and/or methods described herein. For implementation on such devices that are operable to execute software instructions, the flow diagrams and methods described herein may be implemented in processor instructions stored in a computer-readable medium, such as executable software stored in computer memory storage.

Figure 1:
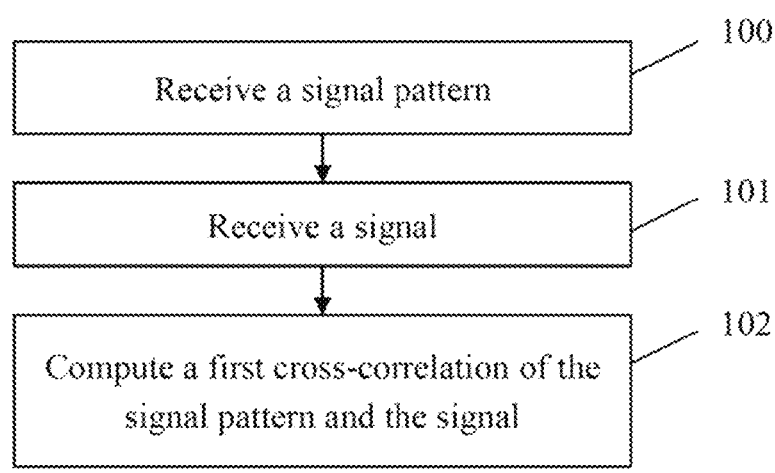
FIG. 1 shows a flow chart of an example embodiment of the trigger method of first aspect of the invention.

FIG. 1 shows a flow chart of an example embodiment of the inventive trigger method for triggering on a signal pattern in a signal. In a first step 100, the signal pattern is received. Then, in a second step 101, the signal is received. Furthermore, in a third step 102, a first cross-correlation of the signal pattern and the signal is computed.

It might be particularly advantageous if the trigger method further comprises the step of triggering based upon the first cross-correlation result. In addition to this or as an alternative, the trigger method may further comprise the step of interpolating the signal pattern and at least a section of the signal correlating with the signal pattern.

Additionally or alternatively, the trigger method may further comprise the step of computing a second cross-correlation of the interpolated signal pattern and the interpolated at least one signal section. Further additionally or further alternatively, the trigger method may further comprise the step of triggering based upon the second cross-correlation result.

With respect to the signal pattern, it is noted that the signal pattern may preferably comprise a signal pattern vector. With respect to the signal, it is noted that the signal may preferably comprise a signal vector. Furthermore, with respect to the first cross-correlation, it is noted that the first cross-correlation may preferably comprise a first cross-correlation vector.

It is further noted that it might be particularly advantageous if the trigger method further comprises the step of shifting the signal pattern through the signal. In addition to this or as an alternative, the trigger method may further comprise the step of defining a threshold. Additionally or alternatively, the trigger method may further comprise the step of finding at least one cluster over the threshold.

Further additionally or further alternatively, the trigger method may especially comprise the step of defining at least one respective cluster border as at least one not successive sample. Moreover, the trigger method may further comprise the step of finding the respective maximum per each of the at least one cluster.

It is further noted that the trigger method may preferably comprise the step of using the respective peak of the second cross-correlation for the respective inter-sample accuracy. With respect to the second cross-correlation, it is noted that the second cross-correlation may preferably comprise a second cross-correlation vector.

It might be particularly advantageous if the trigger method further comprises the step of shortening the signal pattern by a respective leading sample. In addition to this or as an alternative, the trigger method may further comprise the step of shortening the signal pattern by a respective tailing sample.

Additionally or alternatively, the trigger method may further comprise the step of outputting at least one trigger point, preferably a vector of trigger points, comprising the respective sample of the respective maximum per each of the at least one cluster.

Further additionally or further alternatively, the trigger method may further comprise the step of outputting at least one trigger point, preferably a vector of trigger points, comprising the respective sample of the respective maximum per each of the at least one cluster and the corresponding inter-sample offset.

Figure 2:
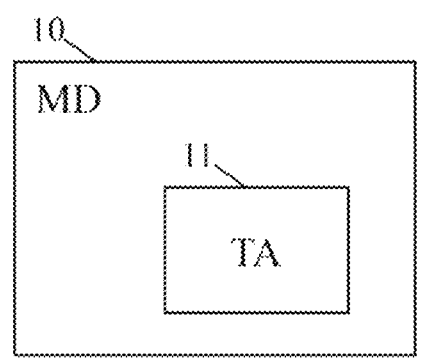
FIG. 2 shows an example embodiment of the measurement device of the second aspect of the invention.

FIG. 2 illustrates an example embodiment of the inventive measurement device 10 comprising a trigger apparatus 11 for triggering on a signal pattern in a signal.

In this context, the trigger apparatus 11 receives the signal pattern and the signal. In addition to this, the trigger apparatus 11 computes a first cross-correlation of the signal pattern and the signal.

In this context, it might be particularly advantageous if the trigger apparatus 11 triggers based upon the first cross-correlation result. Furthermore, the trigger apparatus 11 may preferably interpolate the signal pattern and at least a section of the signal correlating with the signal pattern.

Moreover, the trigger apparatus 11 may especially compute a second cross-correlation of the interpolated signal pattern and the interpolated at least one signal section. In addition to this or as an alternative, the trigger apparatus 11 may preferably trigger based upon the second cross-correlation result.

With respect to the signal pattern, it is noted that the signal pattern may preferably comprise a signal pattern vector. With respect to the signal, it is noted that the signal may preferably comprise a signal vector. With respect to the first cross-correlation, it is noted that the first cross-correlation may preferably comprise a first cross-correlation vector.

Again, with respect to the trigger apparatus 11 of the measurement device 10, it is noted that the trigger apparatus 11 may preferably shift the signal pattern through the signal. In addition to this or as an alternative, the trigger apparatus 11 may preferably define a threshold. Additionally or alternatively, the trigger apparatus 11 may preferably find at least one cluster over the threshold.

Further additionally or further alternatively, the trigger apparatus 11 may especially define at least one respective cluster border as at least one not successive sample. It is further noted that it might be particularly advantageous if the trigger apparatus 11 finds the respective maximum per each of the at least one cluster.

Furthermore, the trigger apparatus 11 may preferably use the respective peak of the second cross-correlation for the respective inter-sample accuracy. With respect to the second cross-correlation, it is noted that the second cross-correlation may preferably comprise a second cross-correlation vector.

Moreover, the trigger apparatus 11 may preferably shorten the signal pattern by a respective leading sample. In addition to this or as an alternative, the trigger apparatus 11 may preferably shorten the signal pattern by a respective tailing sample.

Additionally or alternatively, the trigger apparatus 11 may especially output at least one trigger point, preferably a vector of trigger points, comprising the respective sample of the respective maximum per each of the at least one cluster. Further additionally or further alternatively, the trigger apparatus 11 may especially output at least one trigger point, preferably a vector of trigger points, comprising the respective sample of the respective maximum per each of the at least one cluster and the corresponding inter-sample offset.

Figure 3A:
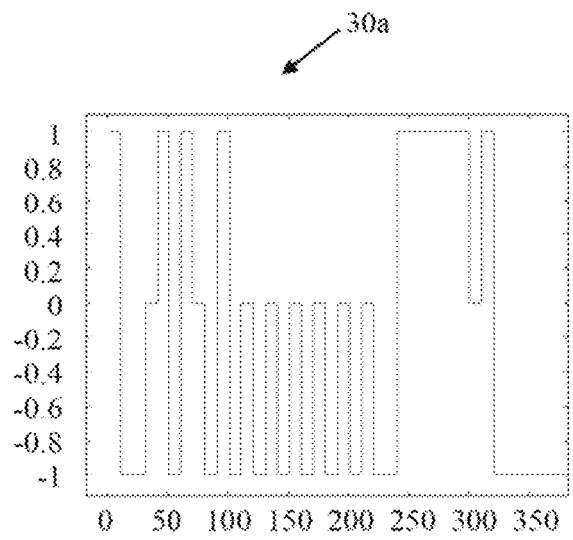
FIGS. 3A-3C show an example signal pattern, signal, and matched signal, respectively.
Figure 3B:
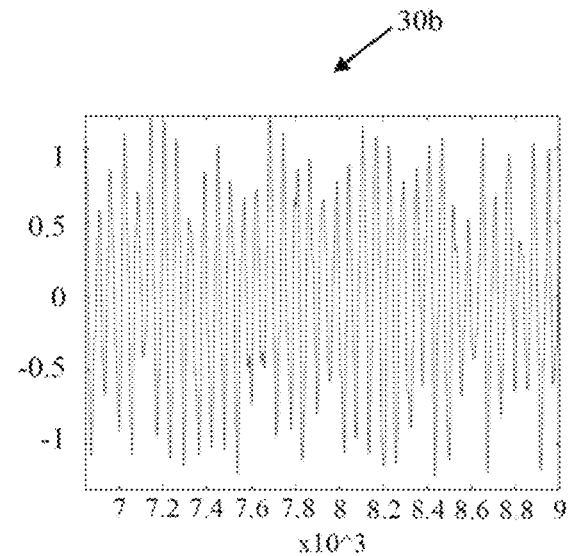
Figure 3C:
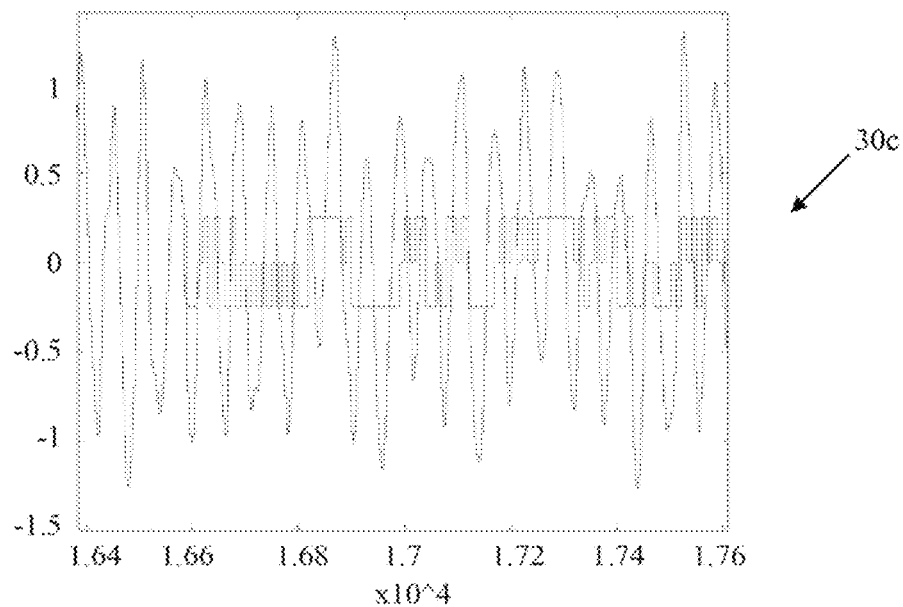

FIG. 3A shows an example signal pattern 30a, FIG. 3B shows an example signal 30b, and FIG. 3C shows the respective example matched signal 30c.

Figure 4A:
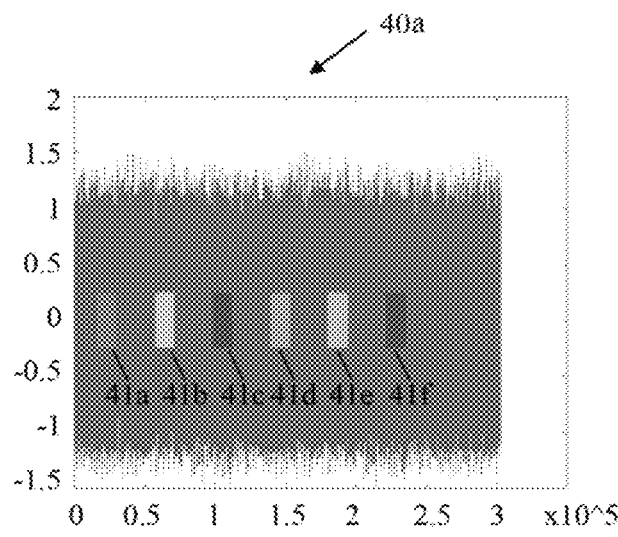
FIGS. 4A-4C show examples illustrating the superior robustness of embodiments of the invention with respect to noise.
Figure 4B:
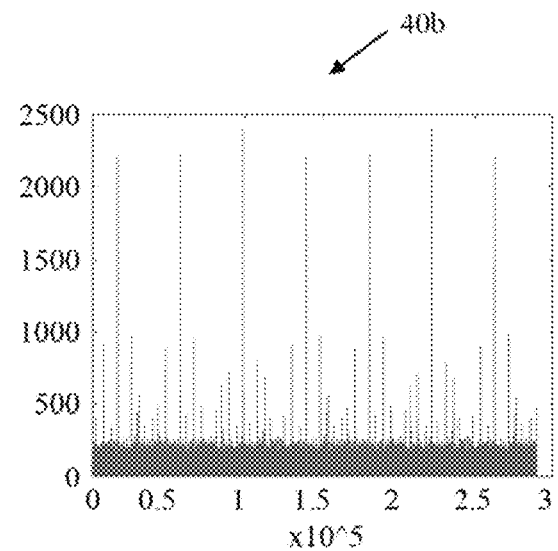
Figure 4C:
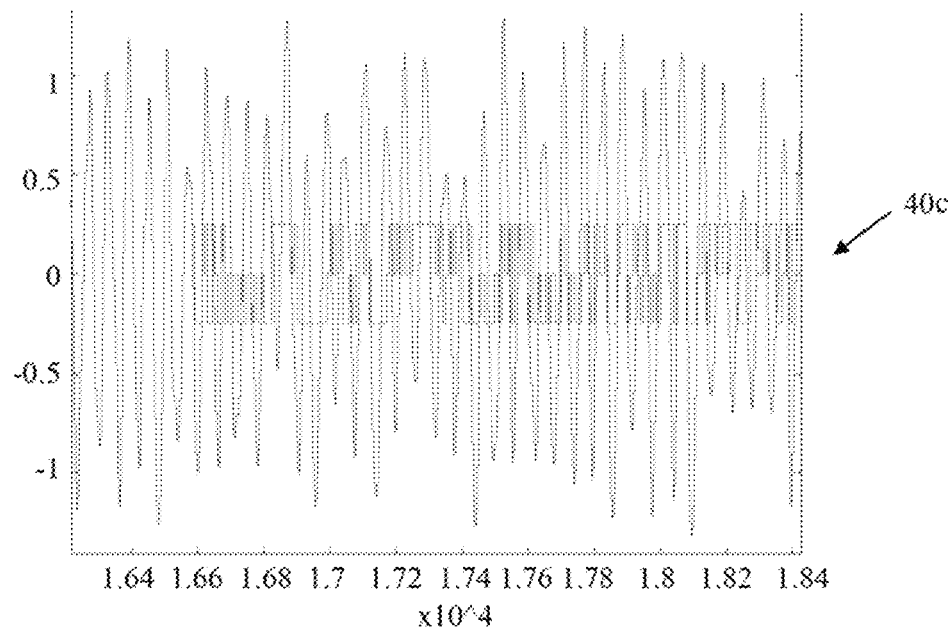

FIGS. 4A-4C show examples 40a, 40b, 40c illustrating the superior robustness of embodiments of the invention with special respect to noise. In this context, the example 40a presents a very noisy curve. The respective trigger marks six positions, for example, the positions 41a, 41b, 41c, 41d, 41e, 41f. Furthermore, 40b shows the respective trigger-signal. The highest peaks are considered as an event. Further, zooming into the respective first event according to 40c, it is shown that the respective signal is destroyed to a degree, which makes it unrecognizable by human observation. Nevertheless, due to the aid of the invention, the respective trigger was accurate. In addition to this, further advantageously, as it takes the whole pattern into account, it also suppresses jitter. Although every edge may be highly altered, the result of considering hundreds of edges can especially stabilize the respective output.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A trigger method for triggering a measuring device based on a signal pattern in a signal, the trigger method comprising the steps of:

receiving the signal by the measuring device;

computing, by the measuring device, a first cross-correlation of the signal pattern and the signal;

triggering the measuring device, based upon the first cross-correlation;

interpolating, by the measuring device, the signal pattern and at least a section of the signal correlating with the signal pattern;

computing, by the measuring device, a second cross-correlation of the interpolated signal pattern and the interpolated at least one signal section;

using, by the measuring device, a respective peak of the second cross-correlation to increase inter-sample accuracy;

defining, by the measuring device, a threshold of trigger;

determining, by the measuring device, at least one cluster over the threshold;

determining, by the measuring device, a respective maximum trigger point for each of the at least one cluster; and outputting, by the measuring device, a vector of trigger points that comprises a respective sample of the respective maximum trigger point for each of the at least one cluster.

2. The trigger method according to claim 1, wherein the trigger method further comprises the step of:
triggering based upon the second cross-correlation.

3. The trigger method according to claim 1, wherein the signal pattern comprises a signal pattern vector.

4. The trigger method according to claim 1, wherein the signal comprises a signal vector.

5. The trigger method according to claim 1, wherein the first cross-correlation comprises a first cross-correlation vector.

6. The trigger method according to claim 1, wherein the trigger method further comprises the step of:
shifting the signal pattern through the signal.

7. The trigger method according to claim 1, wherein the second cross-correlation comprises a second cross-correlation vector.

8. The trigger method according to claim 1, wherein the trigger method further comprises the step of:
shortening the signal pattern by a respective leading sample.

9. The trigger method according to claim 1, wherein the trigger method further comprises the step of:
shortening the signal pattern by a respective tailing sample.

10. The method according to claim 1, wherein the trigger method further comprises the step of:
outputting a vector of trigger points that comprises a respective sample and corresponding inter-sample offset of the respective maximum trigger point for each of the at least one cluster.

11. A measurement device comprising:
a processor configured to trigger on a signal pattern in a signal; and
wherein the processor is configured to receive the signal,
wherein the processor is configured to compute a first cross-correlation of the signal pattern and the signal,
wherein the processor is configured to interpolate the signal pattern and at least a section of the signal correlating with the signal pattern,
wherein the processor is configured to compute a second cross-correlation of the interpolated signal pattern and the interpolated at least one signal section,
wherein the processor is configured to use a respective peak of the second cross-correlation to increase inter-sample accuracy,
wherein the processor is configured to define a threshold of trigger;
wherein the processor is configured to determine at least one cluster over the threshold;
wherein the processor is configured to determine a respective maximum trigger point for each of the at least one cluster; and
wherein the processor is configured to output a vector of trigger points which comprises a respective sample of the respective maximum trigger point for each of the at least one cluster.

* * * * *